United States Patent
Müller et al.

(10) Patent No.: US 7,297,590 B2
(45) Date of Patent: Nov. 20, 2007

(54) METHOD FOR FABRICATING AN INTEGRATED PIN DIODE AND ASSOCIATED CIRCUIT ARRANGEMENT

(75) Inventors: Karlheinz Müller, Velden (DE); Johannes Karl Sturm, Villach (AT)

(73) Assignee: Infineon Technologies, AG, Munich (DE)

( * ) Notice: Subject to any disclaimer, the term of this patent is extended or adjusted under 35 U.S.C. 154(b) by 349 days.

(21) Appl. No.: 10/526,818

(22) PCT Filed: Aug. 14, 2003

(86) PCT No.: PCT/DE03/02740

§ 371 (c)(1), (2), (4) Date: Mar. 3, 2005

(87) PCT Pub. No.: WO2004/025739

PCT Pub. Date: Mar. 25, 2004

(65) Prior Publication Data

US 2006/0008933 A1 Jan. 12, 2006

(30) Foreign Application Priority Data

Sep. 5, 2002 (DE) .............................. 102 41 156

(51) Int. Cl. *H01L 21/8234* (2006.01)

(52) U.S. Cl. ................ 438/237; 257/463; 257/E21.644
(58) Field of Classification Search ................ 438/237, 438/282; 257/463, E21.644
See application file for complete search history.

(56) References Cited

U.S. PATENT DOCUMENTS

| 4,831,430 A | 5/1989 | Umeji |
| 5,355,013 A * | 10/1994 | Parker ........................ 257/458 |
| 5,418,396 A | 5/1995 | Mita |
| 5,550,701 A * | 8/1996 | Nadd et al. ................. 257/355 |
| 6,380,603 B1 | 4/2002 | Takimoto et al. |

FOREIGN PATENT DOCUMENTS

JP 2238664 9/1990

* cited by examiner

*Primary Examiner*—Chandra Chaudhari
(74) *Attorney, Agent, or Firm*—Brinks Hofer Gilson & Lione

(57) ABSTRACT

A method for producing an integrated PIN photodiode. The PIN photodiode contains a doped region of a first conduction type near the substrate and a doped region that is remote from the substrate. The doped region that is remote from the substrate has a different construction type than the region near the substrate. In addition, an intermediate region provided that is a range between the doped region remote from the substrate and the doped region near the substrate. The intermediate region is undoped or provided with weak doping.

20 Claims, 2 Drawing Sheets

Figure 1:
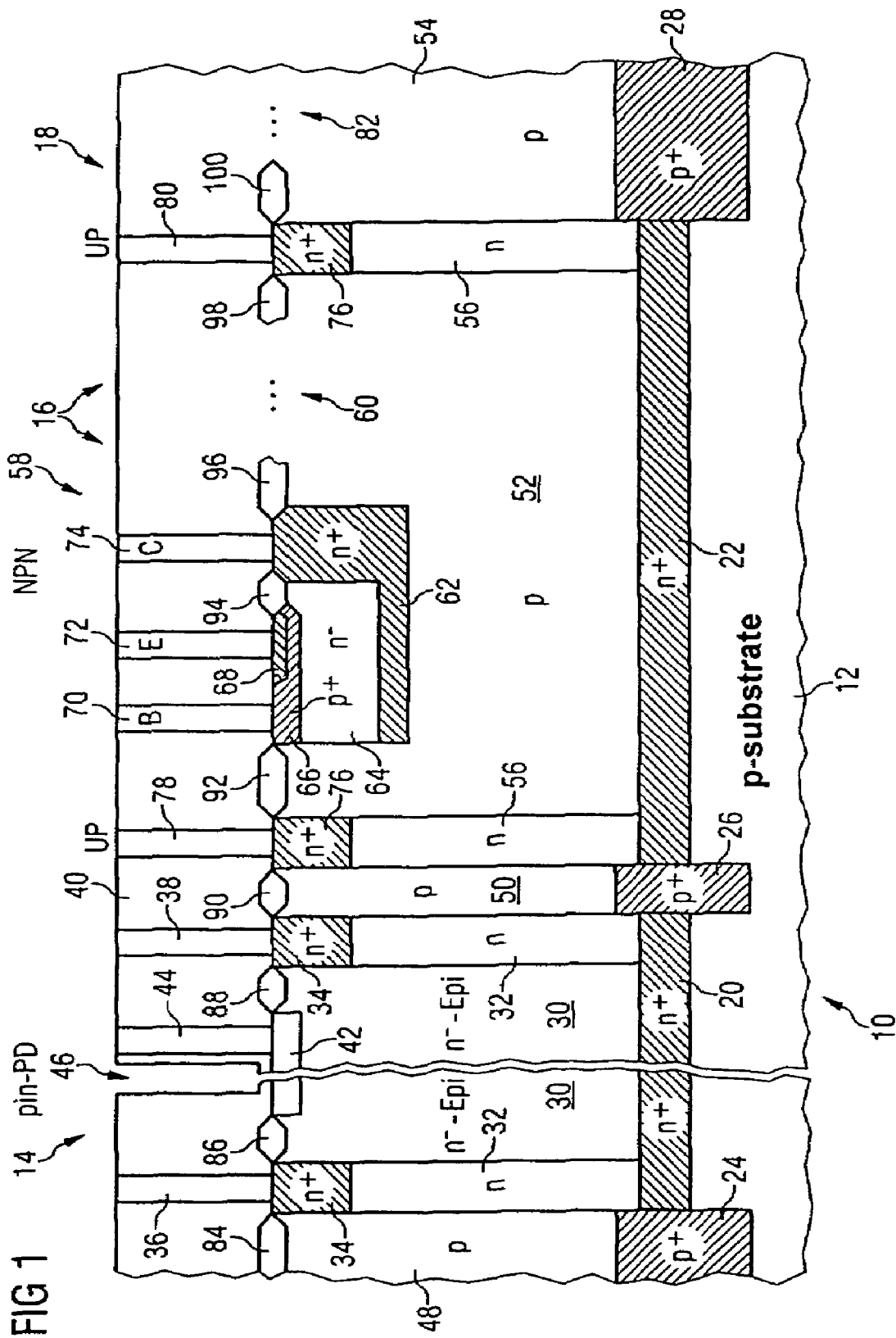

METHOD FOR FABRICATING AN INTEGRATED PIN DIODE AND ASSOCIATED CIRCUIT ARRANGEMENT

This application is the national stage application of international application number PCT/DE03/02740, filed on Aug. 14, 2003, which claims the benefit of priority to German Patent Application 102 41156.5, filed on Sep. 5, 2002, incorporated herein by reference.

The invention relates to a method in which a pin diode carried by a carrier substrate is produced. The pin diode contains a doped region of a first conduction type, which, in respect of the carrier substrate, is near the substrate, a doped region which, in respect of the substrate, is remote from the substrate and is of a different conduction type than the region near the substrate, and an intermediate region, which is arranged between the region remote from the substrate and the region near the substrate and is undoped or provided with a weak doping in comparison with the doping of the region near the substrate and the doping of the region remote from the substrate. Further regions can be arranged between the intermediate region and the region near the substrate, and between the intermediate region and the region remote from the substrate, in order to improve the electrical properties of the pin diode.

A pin diode is a diode having a layer sequence p, i and n, where p denotes a highly p-doped region, i denotes an intrinsically conducting or intrinsic or else only weakly n- or p-doped region, and n denotes a highly n-doped region. The pin junction differs from a pn junction primarily by virtue of the intrinsic or the weakly doped intermediate region. Owing to their electrical properties, pin diodes are used as rectifier diodes for reverse voltages of more than 100 volts. Fast switching diodes in the microwave range constitute a further area of application. Since the reverse current of the pin diode principally depends on the charge generation in the i zone, this diode is also employed as a radiation detector, e.g. in nuclear technology, or as a pin photodiode, in particular for detecting light in the wavelength range between approximately 400 nanometers to about one micrometer. In particular, pin diodes have a high sensitivity and high detection speeds.

Integrated pin diodes have a greater detection sensitivity and a higher frequency bandwidth than individual semiconductor components since they are monolithically connected directly to integrated circuits.

It is an object of the invention to specify a simple method for fabricating an integrated pin diode. Moreover, the intention is to specify an associated integrated circuit arrangement.

The invention is based on the consideration that the integrated pin diode should be fabricated by a method which can easily be embedded in the overall process for fabricating an integrated circuit arrangement and which also as far as possible contains method steps which can also be utilized for producing other electrically active structures in the integrated circuit arrangement.

In the method according to the invention, at least one electrically conductive terminal region which leads to the region near the substrate is produced. The terminal region is arranged in a layer containing the intermediate region and penetrates through this layer, in one refinement, from said layer's interface remote from the substrate as far as said layer's interface near the substrate. In the case of such a method, the region near the substrate is a so-called "buried" region, also referred to as buried layer, in respect of the layer containing the intermediate region. In contrast to a so-called mesa layer stack, the method for fabricating a buried region is simpler. Moreover, in the method according to the invention, the pin diode is not connected via the substrate, but rather via at least one separate terminal region. This results in degrees of freedom for the integration of the pin diode into the integrated circuit arrangement. Moreover, it becomes possible for other structures of the integrated circuit arrangement, for example shielding wells for specific parts of the integrated circuit arrangement, also to be fabricated at the same time as the pin diode. This possibility will be explained in more detail further below.

In one development of the method according to the invention, a doped decoupling region is produced at the same time as the region near the substrate. A circuit arrangement carried by the carrier substrate is produced in such a way that the decoupling region extends between one portion of the components and the carrier substrate. By contrast, no decoupling region lies between the other portion of the components and the carrier substrate. This measure makes it possible, without additional process engineering outlay, to produce a decoupling region which, by way of example, shields circuit portions of the integrated circuit arrangement which cause interference from other circuit portions. On the other hand, however, particularly sensitive circuit portions can also be shielded from the rest of the circuit. In the first case, parasitic currents cannot be impressed e.g. by capacitive coupling into the substrate. In the second case, parasitic currents or voltages do not pass e.g. by means of capacitive coupling from the substrate to the sensitive circuit portions. A combination of both measures leads to improved shielding. Strongly interfering circuit portions are e.g. digital circuits or output amplifiers. Particularly sensitive circuit portions are e.g. preamplifiers.

In a next development of the method for fabricating a pin diode, a terminal region leading to the decoupling region is produced at the same time as the terminal region leading to that layer of the pin diode which is near the substrate. This means that no additional process steps are required for the fabrication of the decoupling region terminal region. The decoupling region can be put at a predetermined potential via the decoupling region terminal region. Moreover, the decoupling region terminal region can be used to produce so-called extraction diodes which extract interference voltages and interference currents from the integrated circuit arrangement. This possibility will be explained in more detail further below.

In a next development, the decoupling region terminal region and the decoupling region form a shielding well which surrounds a region encompassed by the shielding well completely or, relative to the side areas and the base area of the encompassed region, partially, i.e. by at least fifty percent or even by at least seventy five percent. The shielding effect is greater, the more completely the encompassed region is enclosed. However, interruptions in the shielding are also possible in order, by way of example, to enable a simple process implementation for other reasons.

In a next development, in the plane or in the layer in which that region of the pin diode which is near the substrate and the decoupling region are situated, regions situated outside said regions are provided with a doping of a different conduction type. This makes it possible to insulate the region near the substrate and the decoupling region or individual decoupling regions in the plane or layer from one another in a simple manner. In one refinement, an oxide covering the region near the substrate and an oxide covering the decoupling region is utilized for masking an implantation. A simplified process implementation results in comparison with a lithography method.

In a next development, the terminal region leading to that region of the pin diode which is near the substrate and the decoupling region terminal region are produced with the fabrication of a deep trench which preferably has a depth that is at least twice its width. By way of example, the trench has a depth of above ten micrometers, of above fifteen micrometers or even of above twenty micrometers. The trench has a width of less than five micrometers, for example. As an alternative, the terminal regions are fabricated with the aid of a diffusion process in which dopants diffuse from a region remote from the substrate as far as the layer near the substrate or as far as the decoupling layer. Given a diffusion length of ten micrometers, for example, the terminal regions have a width of seven micrometers, for example. In comparison with the area occupied by the pin diode, however, such a width is an acceptable value in respect of the required circuit area. Methods with implantations of a depth of one or more micrometers are also used to fabricate the terminal regions.

In another development, the layer containing the intermediate region is fabricated by an epitaxy process. In one refinement, base material for at least one embedding region, which serves for embedding components of the integrated circuit arrangement, is simultaneously produced during the epitaxy process. The embedding region is also referred to as the so-called bulk. An epitaxy process is a simple possibility for producing layers covering buried layers. However, there are also other possibilities, for example a high-energy ion implantation. Doped semiconductor regions can also be fabricated in a simple manner by means of an epitaxy process, for example by in-situ doping during the growth of the epitaxial layer.

In one development with an epitaxy process, the epitaxy process is conducted in at least two stages. The epitaxial growth is interrupted at the end of the first stage. A different process not connected with an epitaxial growth is then executed. In one refinement, this is a doping process for fabricating a doping which differs from the doping of the epitaxial layer. This measure makes it possible to produce, in a simple manner, further buried regions in addition to that region of the pin diode which is near the substrate and in addition to the decoupling region. The growth of the epitaxial layer is then continued after the other process has been carried out. This procedure means that previously customary methods for fabricating the components of the integrated circuit arrangement can continue to be utilized unchanged.

In a next development, the terminal region leading to that region of the pin diode which is near the substrate encompasses the intermediate region in the lateral direction completely. This measure makes it possible to electrically insulate the intermediate region from the remaining constituent parts of the integrated circuit arrangement in a simple manner.

In a next development, the layer containing the intermediate region is a semiconductor layer which preferably has regions with different conduction types. By way of example, the semiconductor layer is based on a monocrystalline material, e.g. on monocrystalline silicon. However, mixed-crystal semiconductors are also used, such as gallium arsenide.

In a next development, the decoupling region adjoins material with a different electrical conductivity type than the decoupling region. This measure results in pn diodes or np diodes which have the function of extraction diodes and extract interfering charge carriers or interference currents from the region adjoining the decoupling region or prevent the currents from passing to the region to be shielded on account of a blocking effect.

The invention additionally relates to an integrated circuit arrangement having a PIN diode, which can be fabricated by the method according to the invention or by one of its developments. The abovementioned technical effects thus also apply to the circuit arrangement and its developments.

Exemplary embodiments of the invention are explained below with reference to the accompanying drawings, in which:

FIG. 1 shows an integrated circuit arrangement with pin diode and shielding well, and FIGS. 2A to 2D show fabrication stages in the fabrication of the integrated circuit arrangement.

FIG. 1 shows an integrated circuit arrangement 10 containing a p-doped substrate 12, a pin photodiode 14, a shielded region 16 or a plurality of shielded regions and a circuit region 18 or a plurality of nonshielded circuit regions.

The substrate 12 is part of a semiconductor wafer, for example. A buried $n^+$-type region 20 and a buried $n^+$-type region 22 have been produced on the substrate 12 for example by the method explained below with reference to FIG. 2A, $n^+$ denoting a high dopant concentration of dopants which lead to an n conduction type, i.e. of arsenic or phosphor for example. Situated between the regions 20 and 22 are buried $p^+$-type regions 24, 26 and 28 lying in the same plane.

The region 20 belongs to the photodiode 14, which is shown laterally interrupted in FIG. 1. By way of example, the photodiode 14 has an extent of fifty micrometers. Situated above the region 20 is an intermediate region 30 of the photodiode 14, which is weakly n-doped i.e. $n^-$. The intermediate region 30 is completely surrounded laterally by a for example annular terminal region 32, which is n-doped, but with a higher dopant concentration than the intermediate region 30. At its section 34 remote from the substrate, the terminal region 32 is $n^+$-doped in order to ensure a low contact resistance. Interconnects 36 and 38 penetrate through one or more metalization layers 40 of the integrated circuit arrangement 10 and lead to the section 34 of the terminal region 32.

Situated on the intermediate region 30 is a $p^+$-doped region 42, which forms the anode of the photodiode 14. An interconnect 44 penetrates through the metalization layers 40 and is connected to the region 42.

Situated above the region 42 is a cutout 46 in the metalization layers 40. Light can pass through the cutout 46 to the photodiode 14 in order to influence the electrical properties thereof. The cutout 46 is configured such that incident light can penetrate into the photodiode 14 as completely as possible, e.g. through the use of an antireflection layer.

Situated in the same plane as the intermediate region 30 are p-doped regions 48 to 54 of a layer 55, which also contains the intermediate region 30. The regions 48 and 50 adjoin the terminal region 32 outside the photodiode 14. The region 52 forms a so-called bulk or circuit substrate and is part of the shielded region 16. Laterally, the region 52 is bounded by a terminal region 56, which is likewise annular, for example, and reaches as far as the decoupling region 22 and separates the region 52 from the region 50 and 54.

The terminal region 56 and the region 22 form a shielding well which produces functions of a reverse-biased extraction diode. Situated within the shielded region 16 are components with strong interference emission, for example an npn transistor 58 and further components 60, e.g. CMOS components (complementary metal oxide semiconductor) or else with one or more passive components, e.g. coils. The npn transistor 58 and the components 60 have been fabricated by standard fabrication methods.

Thus, by way of example, the npn transistor 58 contains a buried collector terminal region 62, which is heavily n-doped, i.e. n⁺, and leads to a collector region 64. The collector region 64 is weakly n-doped, i.e. n⁻. Situated above the collector region 64 is a base region 66 which is heavily p-doped, and an emitter region 68, which is heavily n-doped. In the region of the transistor 58, the metalization layers 40 are penetrated by interconnects 70, 72 and 74, for example, which lead in this order to the base region 66, to the emitter region 68 and to the collector terminal region 62.

The terminal region 56 is likewise n-doped and has a section 76 remote from the substrate, said section being n⁺-doped. Interconnects 78 and 80 lead to the terminal region 56 and serve for example for applying a positive operating voltage potential UP to the terminal region 56 and thus also to the layer 22, which form the cathode of a reverse-biased extraction diode. The extraction diode completely shields noise currents which might pass into the substrate 12.

The regions 52 and 54 are also referred to as p-well.

The region 18 of the integrated circuit arrangement contains a multiplicity of electronic components 82 which are indicated by three dots in FIG. 1. Interference produced by the transistor 58 and the components 60 cannot penetrate to the components 82 on account of the shielding by the shielding well formed from the terminal region 56 and the region 22.

FIG. 1 additionally illustrates so-called field oxide regions 84 to 100, which are composed of silicon dioxide, for example, and electrically insulate individual components or functional units of components with respect to one another.

In another exemplary embodiment, the interconnects in the metalization layers 40 connect different components of the integrated circuit arrangement 10, e.g. the photodiode 14 to a transistor.

Figure 2A:
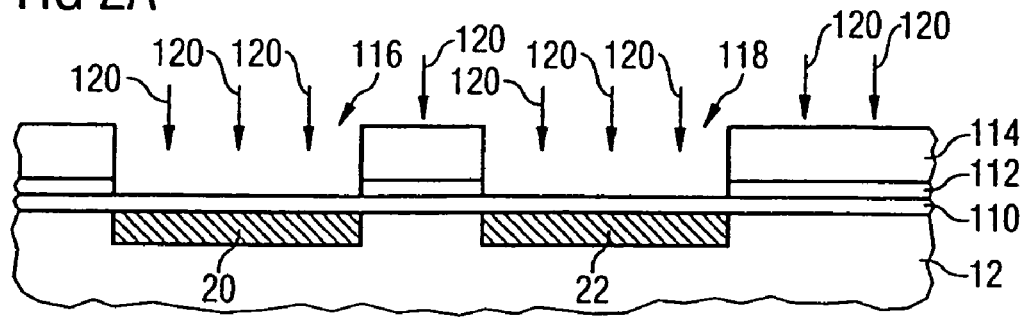

FIG. 2A shows a first fabrication stage during the fabrication of the integrated circuit arrangement 10. Firstly a silicon dioxide layer 110 is produced on the substrate 12, for example by thermal oxidation. The thickness of the silicon dioxide layer 110 is fifty nanometers, for example. A silicon nitride layer 112 is then deposited, which, by way of example, likewise has a thickness of fifty nanometers.

A lithography method for producing an implantation mask for the implantation of dopants for the layers 20 and 22 is then carried out. To that end, a photoresist layer 114 is applied over the whole area and patterned in a subsequent exposure and development step in such a way as to produce cutouts 116 and 118 above the regions in which the regions 20 and 22 are intended to be produced. Afterward, the silicon nitride layer 112 is removed selectively with respect to the silicon dioxide layer 110 in the regions not covered by the photoresist 114, for example in a dry etching method. After the patterning of the silicon nitride layer 112, an ion implantation is carried out in order to implant arsenic or antimony ions, for example, see arrows 120.

Figure 2B:
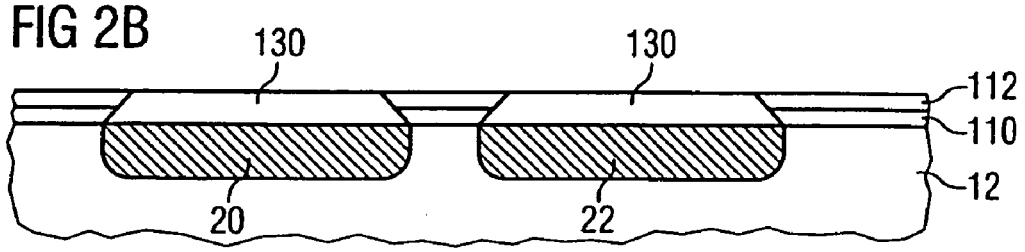

As shown in FIG. 2B, the residual remainder of the photoresist layer 114 is then removed. Afterward, a local oxidation is carried out, thicker oxide regions 130 being produced in the uncovered regions of the silicon dioxide layer 110. The dopants in the regions 20 and 22 are also activated during the oxidation.

Figure 2C:
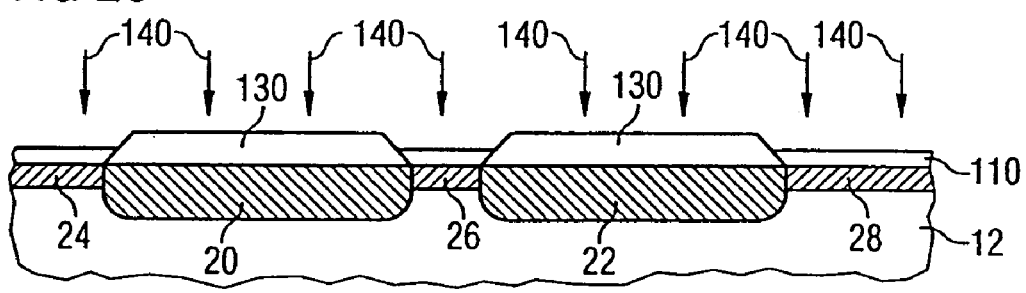

As shown in FIG. 2C, the residues of the nitride layer 112 are then removed, for example with the aid of an etching method. The regions 24 to 28 are then produced with the aid of an ion implantation 140. By way of example, boron is implanted. The energy during the implantation is dimensioned such that the boron ions do not penetrate through the oxide regions 130. By contrast, regions of the silicon dioxide layer 110 whose thickness did not change during the production of the oxidation regions 130 are penetrated by the boron ions.

Figure 2D:
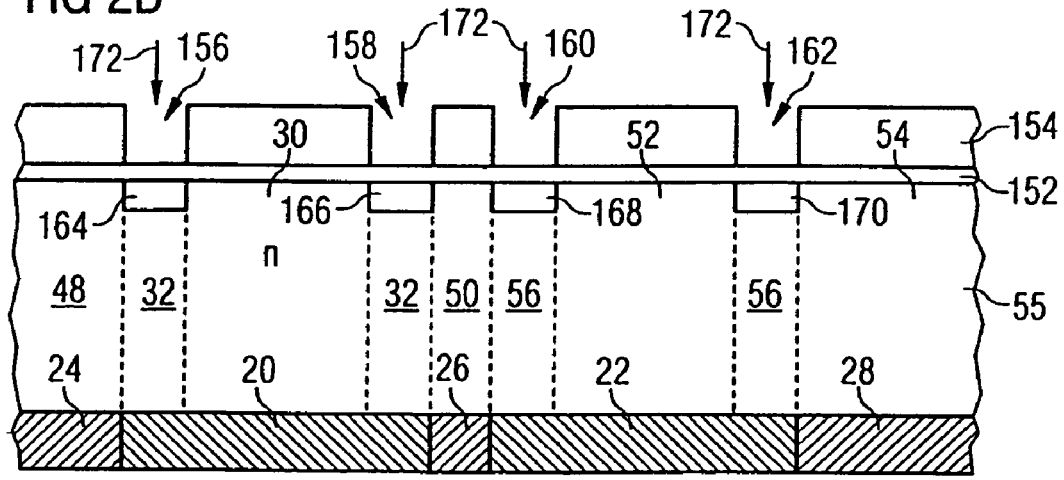

As shown in FIG. 2D, the oxide regions 130 and the residual regions of the silicon dioxide layer 110 are subsequently removed. A layer 55 is applied to the layers 20 and 22 and the regions 24, 26 and 28 by an epitaxy method. The layer 55 is weakly n-doped, for example. In the exemplary embodiment, the layer 55 has a thickness of 10 micrometers. The dopant concentration in the layer 55 is $5 \cdot 10^{13}$ particles per cubic centimeter, by way of example.

A thin silicon dioxide layer 152 is subsequently applied to the layer 55. Afterward, in a lithography method, a photoresist layer 154 is applied and patterned as a mask for a subsequent ion implantation. In the photoresist layer 154, cutouts 156 to 162 are the produced at the regions lying above the edges of the regions 20 and 22. An ion implantation is then carried out, for example using phosphorus ions. The energy during the ion implantation is dimensioned such that the phosphorus ions do not penetrate through the photoresist layer 154. Consequently, the phosphorus ions pass only into original doping regions 164 to 170 directly below the cutouts 156 to 162. By way of example, the dopant concentration in the original doping regions 164 to 170 is $10^{16}$ dopant particles per cubic centimeter. The ion implantation is represented by arrows 172 in FIG. 2D.

Residues of the photoresist layer 154 are then removed. A phototechnology is used to produce a new photoresist mask having cutouts in regions in which the layer 55 is intended to be p-doped. The regions 48, 50, 52 and 54 below the silicon dioxide layer 152 are then doped with the aid of an ion implantation, for example using boron ions.

A diffusion process is then carried out, for example using a diffusion furnace. In this case, firstly the dopants diffuse from the original doping regions 164 to 170 as far as the regions 20 and 22, respectively, the terminal regions 32 and 56 being formed. The dopants are also distributed within the regions 48, 50, 52 and 54 and lead to a p conduction type in said regions 48, 50, 52 and 54.

In another process variant of the method explained with reference to FIG. 2B, an additional lithography method is performed instead of the local oxidation. In this case, it is not necessary to apply a silicon nitride layer 112. The use of a lithography method additionally makes it possible to achieve a situation in which, by way of example, only the regions 24 and 26 are produced, but not the region 28.

In a next process variant, a phosphorus glass coating is utilized instead of the ion implantation in order to produce the doping regions.

In another process variant, the terminal regions 32 and 56 are produced not by diffusion but rather by the production of deep trenches into which doped polysilicon or else a metal is then introduced.

The invention claimed is:
1. A method for fabricating an integrated pin diode:
   producing a doped region of one conduction type which is near a carrier substrate;

producing a doped region remote from the substrate, which is further away from the carrier substrate than the region near the substrate and is of a different conduction type than the conduction type of the region near the substrate;

producing an intermediate region, which is arranged between the region near the substrate and the region remote from the substrate and is undoped or provided with a weak doping in comparison with the doping of the region near the substrate and the doping of the region remote from the substrate;

producing at least one electrically conductive terminal region, which leads to the region near the substrate, in a layer containing the intermediate region;

producing a doped decoupling region at the same time as the region near the substrate, the decoupling region having the same conduction type as the region near the substrate;

producing a circuit arrangement carried by the carrier substrate and containing at least two electronic components; and producing a circuit substrate, which is arranged between the decoupling region and at least one of the components, and the circuit substrate forming a pn diode or an np diode with the decoupling region, the decoupling region being arranged between one portion of the components and the carrier substrate and not between the other portion of the components and the carrier substrate, and in a layer in which the region near the carrier substrate and the decoupling region are arranged, regions outside the region near the substrate and the decoupling region are provided with a doping of a different conduction type from the region near the substrate and the decoupling region or are undoped.

2. The method as claimed in claim 1, wherein the terminal region penetrates through the layer from an interface remote from the substrate as far as an interface near the substrate.

3. The method as claimed in claim 1, comprising producing an electrically conductive decoupling region terminal region at the same time as the production of the terminal region leading to the region near the substrate.

4. The method as claimed in claim 3, wherein the decoupling region terminal region and the decoupling region form a shielding well which completely surrounds a region encompassed by the shielding well.

5. The method as claimed in claim 3, wherein, in the layer in which the region near the substrate and the decoupling region are arranged, the regions outside the region near the substrate and the decoupling region are provided with a doping of a different conduction type, an oxide covering the region near the substrate and the decoupling region serve for masking implantation.

6. The method as claimed in claim 1, wherein at least one of:
the terminal region is produced with fabrication of a trench;
the terminal region is fabricated with the aid of a diffusion process in which dopants diffuse from a region remote from the substrate as far as the layer near the substrate; or
the terminal region is produced by an implantation method.

7. The method as claimed in claim 1, wherein at least one of:
the layer containing the intermediate region is produced by an epitaxy method; or
a base material for an embedding region, which serves for embedding components of an integrated circuit arrangement, is produced simultaneously during the epitaxy method.

8. The method as claimed in claim 7, wherein an epitaxy method for producing an epitaxial layer is conducted in at least two stages,
the epitaxial growth being interrupted,
the interruption being followed by execution of at least one other process, or
the growth of the epitaxial layer being continued after the execution of the at least one other process.

9. The method as claimed in claim 1, wherein the terminal region leading to the region near the substrate laterally encompasses the intermediate region.

10. The method as claimed in claim 1, wherein the layer containing the intermediate region is a semiconductor layer which contains regions with different conduction types.

11. The method as claimed in claim 1, wherein the decoupling region adjoins material with a different conduction type or is surrounded by material with a different conduction type.

12. An integrated circuit arrangement having a pin diode comprising:
a carrier substrate which carries a region sequence of a pin diode;
a doped region of one conduction type, which is contained in the region sequence and is near the substrate;
a doped region remote from the substrate, which is contained in the region sequence, is further away from the carrier substrate than the region near the substrate, and is of a different conduction type than the conduction type of the region near the substrate;
an intermediate region which is arranged between the region near the substrate and the region remote from the substrate and is undoped or provided with a weak doping in comparison with the doping of the region near the substrate and the doping of the region remote from the substrate;
an electrically conductive terminal region, which leads to the region near the substrate and is arranged in a layer containing the intermediate layer;
a circuit arrangement carried by the carrier substrate and containing at least two electronic components;
a doped decoupling region arranged between one component and the carrier substrate and of the same conduction type as the region near the substrate and arranged in one plane with the region near the substrate; and
a circuit substrate, which is arranged between the decoupling region and at least one of the components, the circuit substrate forming a pn diode or an np diode with the decoupling region,
the decoupling region being arranged between one portion of the components and the carrier substrate and not between the other portion of the components and the carrier substrate, and
in a layer in which the region near the substrate and the decoupling region are arranged, regions outside the region near the substrate and the decoupling region are provided with a doping of a different conduction type or are undoped.

13. The circuit arrangement as claimed in claim 12, wherein the terminal region penetrates through the layer from an interface remote from the substrate as far as an interface near the substrate.

14. The circuit arrangement as claimed in claim 12, wherein the decoupling region has the same dopant concentration as the region near the substrate.

15. The circuit arrangement as claimed in claim 14, further comprising an electrically conductive decoupling region terminal region, at least one of:
- which leads to the decoupling region; or
- which has the same material composition as the terminal region leading to the region near the substrate.

16. The method as claimed in claim 6, wherein a depth of the trench is at least twice a width of the trench.

17. The method as claimed in claim 8, wherein the at least one other process comprises a doping process for fabricating a doping which differs from a doping of the epitaxial layer.

18. The method as claimed in claim 9, wherein the terminal region leading to the region near the substrate completely laterally encompasses the intermediate region.

19. The method as claimed in claim 11, wherein the decoupling region is surrounded by the material with a different conduction type on all sides apart from one or a plurality of decoupling region terminal regions.

20. The method as claimed in claim 3, wherein the decoupling region terminal region and the decoupling region form a shielding well which surrounds a region encompassed by the shielding well, relative to the side areas and the base area of the encompassed region, by at least fifty percent or by at least seventy five percent.

* * * * *